US012611856B2

(12) United States Patent
Yoo

(10) Patent No.: US 12,611,856 B2
(45) Date of Patent: Apr. 28, 2026

(54) APPARATUS FOR MANUFACTURING LED REFLECTIVE SHEET

(71) Applicant: SANHEUNG EZ INC., Yangju-si (KR)

(72) Inventor: Sang Hyeon Yoo, Yangju-si (KR)

(73) Assignee: SANHEUNG EZ INC., Yangju-si (KR)

( * ) Notice: Subject to any disclaimer, the term of this patent is extended or adjusted under 35 U.S.C. 154(b) by 90 days.

(21) Appl. No.: 18/786,119

(22) Filed: Jul. 26, 2024

(65) Prior Publication Data

US 2025/0242581 A1 Jul. 31, 2025

(30) Foreign Application Priority Data

Jan. 25, 2024 (KR) ........................ 10-2024-0011814

(51) Int. Cl.
| | |
|---|---|
| *B41F 9/00* | (2006.01) |
| *B41F 9/10* | (2006.01) |
| *B41F 13/00* | (2006.01) |
| *B41F 13/008* | (2006.01) |
| *B41F 13/02* | (2006.01) |

(Continued)

(52) U.S. Cl.
CPC ................ *B41F 9/003* (2013.01); *B41F 9/10* (2013.01); *B41F 13/0024* (2013.01); *B41F 13/008* (2013.01); *B41F 13/02* (2013.01); *B41F 13/18* (2013.01); *B41F 13/20* (2013.01); *B41F 23/0403* (2013.01); *B41F 31/20* (2013.01);

(Continued)

(58) Field of Classification Search
CPC ........ B41F 9/06–068; B41F 9/08; B41F 9/10; B41F 9/003; B41F 13/008; B41F 13/012;

B41F 13/02; B41F 13/18; B41F 13/187; B41F 13/0024; B41F 13/20; B41F 23/0403; B41F 31/20; H10H 20/0364; H10H 20/856

See application file for complete search history.

(56) References Cited

U.S. PATENT DOCUMENTS

| | | | | |
|---|---|---|---|---|
| 3,098,432 A | * | 7/1963 | Bechtold | ................. B41F 13/02 101/152 |
| 5,103,723 A | * | 4/1992 | Maier | ..................... B41F 9/063 101/351.4 |
| 5,894,797 A | * | 4/1999 | Brennan | ............ B65H 23/1888 226/42 |

FOREIGN PATENT DOCUMENTS

| | | | |
|---|---|---|---|
| DE | 102011121319 A1 * | 6/2013 | ............. B41F 13/24 |
| KR | 20-0451991 Y1 | 1/2011 | |

(Continued)

OTHER PUBLICATIONS

Machine Translation of Cheol (KR101525436B1), Jun. 10, 2015 (generated Dec. 10, 2025), Espacenet (Year: 2014).*

(Continued)

*Primary Examiner* — Andrew L Swanson
(74) *Attorney, Agent, or Firm* — United One Law Group LLC; Kongsik Kim; Jhongwoo Peck

(57) ABSTRACT

In an apparatus for manufacturing an LED reflective sheet, release paper adhesive printing grooves are integrally formed on both sides of a printing roller having pattern printing grooves formed therein along an outer circumference thereof, such that when printing a light-induced pattern on the reflective sheet through the printing roller, a release paper adhesive pattern is also printed, thus both ends of the release paper are adhered to the release paper adhesive pattern during attaching the release paper to the reflective (Continued)

sheet, and thereby preventing an occurrence of a lifting phenomenon between the release paper and the reflective sheet.

6 Claims, 8 Drawing Sheets

(51) Int. Cl.

| | | |
|---|---|---|
| *B41F 13/18* | (2006.01) | |
| *B41F 13/20* | (2006.01) | |
| *B41F 23/04* | (2006.01) | |
| *B41F 31/20* | (2006.01) | |
| *H10H 20/01* | (2025.01) | |
| *H10H 20/856* | (2025.01) | |

(52) U.S. Cl.

CPC ....... *H10H 20/0364* (2025.01); *H10H 20/856* (2025.01)

(56) References Cited

FOREIGN PATENT DOCUMENTS

| | | | |
|---|---|---|---|
| KR | 10-1144894 B1 | 5/2012 | |
| KR | 10-1269666 B1 | 5/2013 | |
| KR | 101525436 B1 * | 6/2015 | ............... F21V 7/22 |
| KR | 10-2391807 B1 | 4/2022 | |

OTHER PUBLICATIONS

Machine translation of Melischko (DE102011121319A1), Jun. 20, 2013 (generated Dec. 10, 2025), Espacenet (Year: 2013).*

* cited by examiner

APPARATUS FOR MANUFACTURING LED REFLECTIVE SHEET

CROSS REFERENCE TO RELATED APPLICATION

This application claims priority from Korean Application No. 10-2024-0011814 filed on Jan. 25, 2024, which is incorporated herein by reference in its entirety.

BACKGROUND

1. Technical Field

The present invention relates to an apparatus for manufacturing an LED reflective sheet, and more specifically, to an improved apparatus for manufacturing an LED reflective sheet, in which release paper adhesive printing grooves are integrally formed on both sides of a printing roller having pattern printing grooves formed therein along an outer circumference thereof, such that when printing a light-induced pattern on the reflective sheet through the printing roller, a release paper adhesive pattern is also printed, thus both ends of the release paper are adhered to the release paper adhesive pattern during attaching the release paper to the reflective sheet, and thereby preventing an occurrence of a lifting phenomenon between the release paper and the reflective sheet.

2. Description of the Related Art

In general, an LED reflective sheet is a sheet which has a light-induced pattern printed on a surface thereof, and when irradiating it with light from LEDs, emits light by reflecting the light by the light-induced pattern portion. The LED reflective sheets are used for billboard signs, road signs, POPs, window signs and the like.

An example of an apparatus for manufacturing a reflective sheet is disclosed in Korean Utility Model Registration No. 20-0451991.

The conventional apparatus for manufacturing a reflective sheet disclosed in the above registered utility model includes: a reflective sheet supply unit configured to supply a reflective sheet wound on a roll in the form of a coil; a pattern printing unit configured to form a light-induced pattern on the surface of the reflective sheet supplied through the reflective sheet supply unit; a drying unit configured to dry the light-induced pattern formed on the surface of the reflective sheet; a release paper supply roll configured to supply a release paper to be attached to the surface of the reflective sheet on which the light-induced pattern is formed; a release paper attachment unit including a release paper pressing roll configured to press the release paper so as to be adhered to the surface of the reflective sheet; and a discharge unit configured to wind the reflective sheet having the release paper attached thereto in the form of a coil.

However, the reflective sheet manufactured by the conventional apparatus for manufacturing a reflective sheet is stored in a roll type with the release paper attached to protect the light-induced pattern, and the release paper is only attached to the light-induced pattern having adhesiveness. Therefore, when the reflective sheet attached with the release paper is rolled and stored in the roll type, an edge portion of the reflective sheet is frequently lifted due to refraction, such that air flows into the lifted space to cause an adhesive liquid to be harden or dried, and thereby increasing the defect rate of a product.

SUMMARY

The present invention is proposed to improve the above-described problems, and it is an object thereof to provide an apparatus for manufacturing an LED reflective sheet, in which release paper adhesive printing grooves are integrally formed on both sides of a printing roller having pattern printing grooves formed therein along an outer circumference thereof, such that when printing a light-induced pattern on the reflective sheet through the printing roller, a release paper adhesive pattern is also printed, thus both ends of the release paper are adhered to the release paper adhesive pattern during attaching the release paper to the reflective sheet, and thereby preventing an occurrence of a lifting phenomenon between the release paper and the reflective sheet to resolve a problem in terms of a decrease in adhesion due to air inflow.

Another object of the present invention is to provide an apparatus for manufacturing an LED reflective sheet having improved structures for controlling the tension of a sheet and for adjusting a gap between a rubber roller and a printing roller so as to maintain the best printing conditions when printing a light-induced pattern and a release paper adhesive pattern on the reflective sheet, as well as an improved structure for adjusting the position of a reflective liquid tray.

To achieve the above objects, according to an aspect of the present invention, there is provided an apparatus for manufacturing an LED reflective sheet, the apparatus including: a structural frame; a reflective sheet supply roll rotatably installed in the middle of the structural frame to supply a reflective sheet; a printing unit installed in the front of the structural frame to print a light-induced pattern and a release paper adhesive pattern on the supplied reflective sheet through an adhesive reflective liquid; a dryer installed on an upper portion of the structural frame to dry the reflective sheet on which the light-induced pattern and the release paper adhesive pattern are printed while passing therethrough; a winding roll rotatably installed in the rear of the structural frame to wind the reflective sheet dried while passing through the dryer in the form of a roll; a release paper supply unit configured to supply a release paper to a surface of the reflective sheet on which the light-induced pattern and the release paper adhesive pattern are printed before the reflective sheet is wound on the winding roll so that the release paper and the reflective sheet are wound together in a state where they are laminated; and a plurality of guide rollers installed between the reflective sheet supply roll, the printing unit, the dryer and the winding roll to guide the reflective sheet, wherein the printing unit includes a rubber roller and a printing roller which are arranged vertically to guide the reflective sheet therebetween while rotating in a direction where they are engaged with each other, and is configured so that: the printing roller includes pattern printing grooves into which an adhesive reflective liquid for printing the light-induced pattern is injected and release paper adhesive printing grooves into which the adhesive reflective liquid for printing the release paper adhesive pattern is injected, which are formed in an outer peripheral surface thereof; a tray for storing the adhesive reflective liquid is installed under the printing roller, thereby, when the printing roller rotates while a portion of a lower side the printing roller is immersed in the adhesive reflective liquid, the adhesive reflective liquid is applied to an outer peripheral surface of the printing roller; a knife having an end in contact with the outer peripheral surface of the printing roller is installed on one side of the printing roller, thereby when the printing roller to which the adhesive reflective liquid is applied rotates, the adhesive reflective liquid applied to the outer peripheral surface of the printing roller is removed so that the adhesive reflective liquid remains only in the pattern printing grooves and the release paper adhesive printing grooves; and thus, when the reflective sheet passes between the rubber roller and the printing roller, the adhesive reflective liquid remaining in the pattern printing grooves and the release paper adhesive printing grooves of the printing roller is transferred to the reflective sheet to be printed thereon, wherein the release paper supply unit includes a release paper supply roll configured to supply a release paper, and a pair of lamination rollers configured to rotate in a direction where they are engaged with each other, thereby, the release paper is supplied between the pair of lamination rollers when the reflective sheet passes therethrough, so that the reflective sheet and the release paper are wound together on the winding roll in a state where they are laminated, and the apparatus further including: a tension load cell installed in a portion of the structural frame where the reflective sheet supplied from the reflective sheet supply roll passes to constantly adjust a tension of the supplied reflective sheet; a printing roller mounting means configured to rotatably install the printing roller in the structural frame; a rubber roller position adjustment means configured to adjust a degree of adhesion with the printing roller by regulating the position of the rubber roller, a tray position adjustment means configured to adjust a height of the tray to control a gap between it and the printing roller; a knife operating means configured to adjust the position of the knife so that the knife selectively comes into close contact with the printing roller.

Preferably, the release paper adhesive printing groove formed in the printing roller has a constant width, and includes a first partition and a second partition formed in parallel to each other at a predetermined interval in the middle of a width direction, so that the release paper adhesive printing groove is divided into a first groove, a second groove and a third groove from an inside, thereby allowing the adhesive reflective liquid to be reliably injected into the first groove, the second groove and the third groove, respectively, without leaving any gaps.

Preferably, the printing roller mounting means are respectively installed on both sides of the structural frame to support both ends of the printing roller, and include: a longitudinal moving rod which is installed to penetrate a portion of the structural frame at a position corresponding to the printing roller, and has a male thread portion formed on an outer peripheral surface at a rear end portion thereof; a binder formed integrally with a front end of the longitudinal moving rod and having a binder protrusion protruding from a front surface thereof; a support plate fixed to the structural frame so that the longitudinal moving rod penetrates; and a circular plate which is rotatably coupled to a front surface of the support plate, and has a hole formed in a center thereof, through which the longitudinal moving rod penetrates, and a female thread portion formed in the hole corresponding to the male thread portion of the longitudinal moving rod, wherein, when rotating the circular plate, the longitudinal moving rod moves forward or backward along threads; and binding holes corresponding to the binder protrusions are formed in both ends of the printing roller, thus the printing roller is placed so that the binder protrusions are inserted into the binding holes, and in this state, the longitudinal moving rod is moved forward to cause the binder protrusions are inserted into the binding holes and fixed thereto.

Preferably, the rubber roller position adjustment means are respectively installed on both sides of the structural frame to support both ends of the rubber roller, and include: a pair of moving plate guides fixed to the structural frame at a predetermined interval at positions corresponding to the rubber roller; a vertical moving plate which is fitted and assembled between the pair of moving plate guides to be moved vertically along the moving plate guides, and has an axis insertion hole formed in the middle thereof, into which an axis of the rubber roller is inserted, wherein the axis insertion hole is formed to open in one direction so that the axis of the rubber roller can be inserted; a cover plate fixed to a surface having an opening communicated with the axis insertion hole of the vertical moving plate, thus to selectively cover the opening; a pressing bolt fastened to penetrate the cover plate, of which an end is installed in close contact with the axis of the rubber roller to hold the axis of the rubber roller so as not to be moved along the axis insertion hole; a vertical rod extending upward from an upper portion of the vertical moving plate and having a male thread portion formed on an outer peripheral surface thereof; a rubber-roller worm gear which is rotatably installed in the structural frame at a position corresponding to the middle portion of the vertical rod and has a hollow in which a female thread portion screwed with the male thread portion of the vertical rod is formed in the center thereof so that the vertical rod is fastened therethrough; a rubber-roller worm wheel which is rotatably installed in the structural frame and is meshed with the rubber-roller worm gear; and a rubber-roller handle configured to rotate the rubber-roller worm wheel, and wherein the axis of the rubber roller is inserted into the axis insertion hole of the vertical moving plate, and then fixed so as not to be moved by the pressing bolt, and in this state, when rotating the rubber-roller worm wheel in one direction or a direction opposite thereto through the rubber-roller handle, the rubber-roller worm gear rotates, then the vertical rod is moved up or down along threads, and the vertical moving plate is also moved up or down together with the vertical rod to adjust the position of the rubber roller.

Preferably, the tray position adjustment means are respectively installed on both sides of the structural frame to support both ends of the tray, and include: a rotation axis installed to penetrate the structural frame blow the tray; a tray worm gear coupled to an outer end of the rotation axis to be rotated together with the rotation axis; a tray worm wheel installed to be meshed with the tray worm gear; a tray handle configured to rotate the tray worm wheel; a pinion gear coupled to an inner end of the rotation axis to be rotated together with the rotation axis; a lifting bar extending vertically downward from a lower portion of the tray and has a rack gear formed on an outer peripheral surface thereof to be meshed with the pinion gear; and supports fixed to the structural frame to hold the lifting bar so as not to be shaken during moving up or down, wherein, when rotating the tray worm wheel in one direction or a direction opposite thereto through the tray handle, the tray worm gear rotates, and the rotation axis is also rotated, and the pinion gear coupled to an inner end of the rotation axis is rotated so that the lifting bar is moved up or down along the meshed rack gear to adjust the position of the tray.

Preferably, the knife operating means includes: a rotating rod which is rotatably assembled to the structural frame before the printing roller, of which a lower end protrudes downward by penetrating the structural frame, and includes knives installed on an upper portion thereof at a predetermined interval by being fixed thereto through a plurality of fixtures to be operated together, and a locking protrusion formed on a portion of the lower end, which protrudes in a direction perpendicular to a longitudinal direction thereof; a circular fixing block rotatably installed on an outer side of the structural frame, and including a rod insertion hole formed therein, into which the lower end of the rotating rod is inserted, and a locking groove formed in a portion thereof defining the rod insertion hole by penetrating in one direction, through which the locking protrusion of the rotating rod is inserted and coupled; a knife worm gear integrally formed with a portion of the circular fixing block along an outer peripheral surface thereof; a knife worm wheel which is meshed with the knife worm gear to be rotated; and a knife handle configured to rotate the knife worm wheel, wherein, when rotating the knife worm wheel in one direction or a direction opposite thereto through the knife handle, the knife worm gear rotates and the circular fixing block is also rotated together, and the rotating rod connected to the circular fixing block by the locking protrusion and the locking groove is also rotated together, such that the knife coupled to the rotating rod selectively comes into contact with or is separated from the outer peripheral surface of the printing roller.

In the apparatus for manufacturing an LED reflective sheet according to the present invention, the release paper adhesive printing grooves are integrally formed on both sides of the printing roller having pattern printing grooves formed therein along an outer circumference thereof, such that when printing a light-induced pattern on the reflective sheet through the printing roller, a release paper adhesive pattern is also printed, and both ends of the release paper are adhered to the release paper adhesive pattern during attaching the release paper to the reflective sheet, thus a lifting phenomenon between the release paper and the reflective sheet does not occur, and thereby the problem in terms of a decrease in adhesion due to air inflow between the release paper and the reflective sheet is resolved, and the reflective sheet may be stored for a long period of time.

In addition, since the apparatus for manufacturing an LED reflective sheet according to the present invention has improved structures for controlling the tension of a base sheet and for adjusting a gap between the rubber roller and the printing roller, as well as an improved structure for adjusting the position of a reflective liquid tray, it is possible to maintain the best printing conditions when printing a light-induced pattern and a release paper adhesive pattern on the reflective sheet, and manufacture the highest quality reflective sheet.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
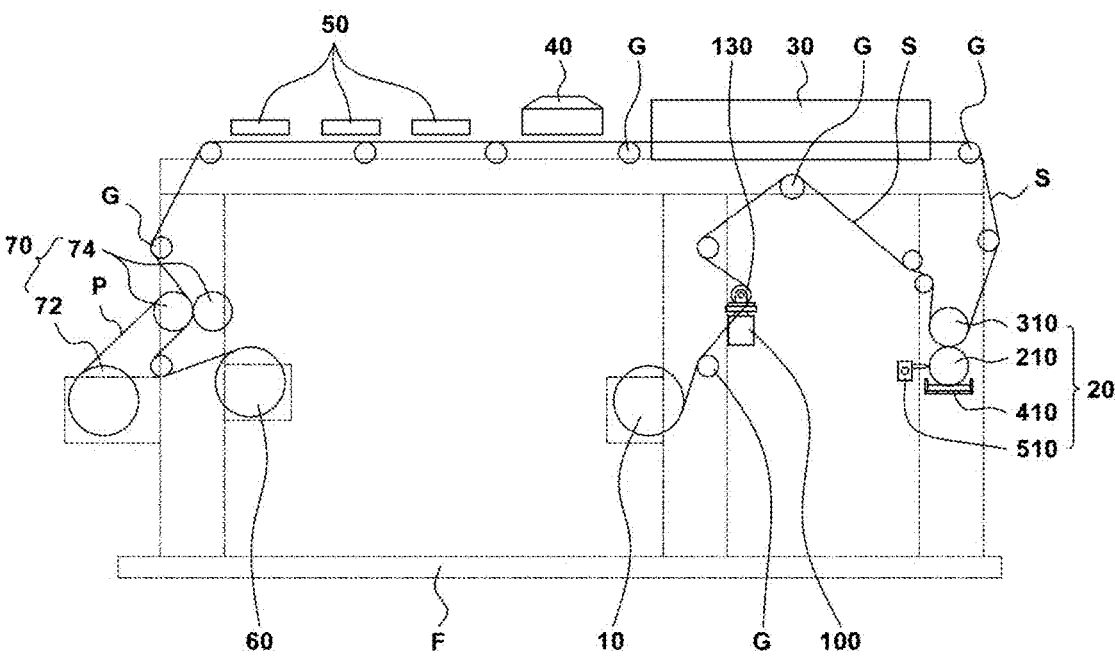
FIG. 1 is a view schematically illustrating the configuration of an apparatus for manufacturing an LED reflective sheet according to the present invention.
Figure 2:
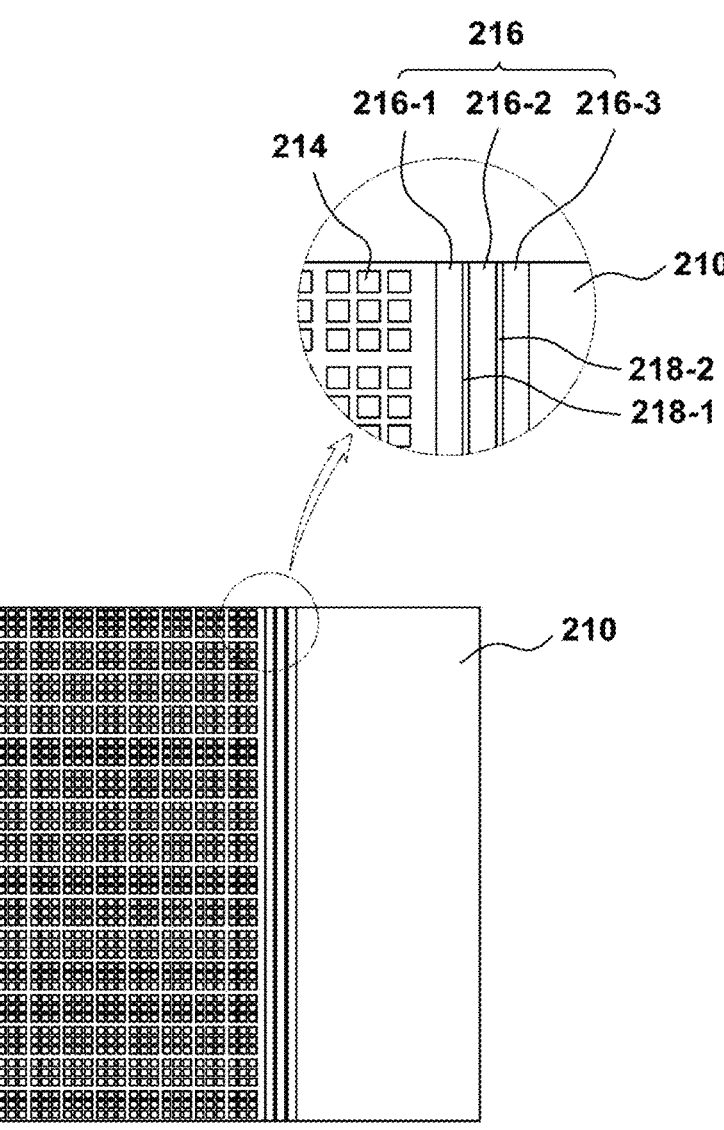
FIG. 2 is a front view illustrating a portion of a printing roller used in the apparatus for manufacturing an LED reflective sheet according to the present invention.

Hereinafter, the present invention will be described in detail with reference to the accompanying drawings.

Referring to FIGS. 1 to 7, the apparatus for manufacturing an LED reflective sheet according to the present invention includes: a structural frame F; a reflective sheet supply roll 10 rotatably installed in the middle of the structural frame F to supply a reflective sheet S; a printing unit 20 installed in the front of the structural frame F to print a light-induced pattern H1 and a release paper adhesive pattern H2 on the supplied reflective sheet S through an adhesive reflective liquid; a dryer 30 installed on an upper portion of the structural frame F to dry the reflective sheet S on which the light-induced pattern H1 and the release paper adhesive pattern H2 are printed while passing therethrough; a winding roll 60 rotatably installed in the rear of the structural frame F to wind the reflective sheet S dried while passing through the dryer 30 in the form of a roll; a release paper supply unit 70 configured to supply a release paper P to a surface of the reflective sheet on which the light-induced pattern and the release paper adhesive pattern are printed before the reflective sheet S is wound on the winding roll 60 so that the release paper P and the reflective sheet S are wound together in a state where they are laminated; and a plurality of guide rollers G installed between the reflective sheet supply roll 10, the printing unit 20, the dryer 30 and the winding roll 60 to guide the reflective sheet S.

Here, the printing unit 20 includes a rubber roller 310 and a printing roller 210 which are arranged vertically to guide the reflective sheet S therebetween while rotating in a direction where they are engaged with each other, and is configured so that: the printing roller 210 includes pattern printing grooves 214 into which an adhesive reflective liquid for printing the light-induced pattern H1 is injected and release paper adhesive printing grooves 216 into which the adhesive reflective liquid for printing the release paper adhesive pattern H2 is injected, which are formed in an outer peripheral surface thereof; a tray 410 for storing the adhesive reflective liquid is installed under the printing roller 210, thereby, when the printing roller 210 rotates while a portion of a lower side of the printing roller 210 is immersed in the adhesive reflective liquid, the adhesive reflective liquid is applied to an outer peripheral surface of the printing roller 210; a knife 510 having an end in contact with the outer peripheral surface of the printing roller is installed on one side of the printing roller 210, thereby, when the printing roller 210 to which the adhesive reflective liquid is applied rotates, the adhesive reflective liquid applied to the outer peripheral surface of the printing roller is removed so that the adhesive reflective liquid remains only in the pattern printing grooves 214 and the release paper adhesive printing grooves 216; and thus, when the reflective sheet S passes between the rubber roller 310 and the printing roller 210, the adhesive reflective liquid remaining in the pattern printing grooves 214 and the release paper adhesive printing grooves 216 of the printing roller 210 is transferred to the reflective sheet S to be printed thereon.

In addition, it is preferable that the pattern printing grooves 214 formed in the printing roller 210 are arranged in a grid pattern in a state where a plurality of square grooves are spaced apart from each other at a predetermined interval. However, the pattern printing groove 214 is not limited to the grid pattern, and may be formed to have other patterns as necessarily.

Further, the release paper adhesive printing grooves 216 are formed at a predetermined interval from the ends on both sides of the printing roller 210, that is, these groves are formed to have the shape of a circular band along the outer peripheral surface. In particular, it is preferable that the release paper adhesive printing groove 216 applied to the present invention has a constant width, and includes a first partition 218-1 and a second partition 218-2 formed in parallel to each other at a predetermined interval in the middle of a width direction, so that the release paper adhesive printing groove 216 is divided into a first groove 216-1, a second groove 216-2 and a third groove 216-3 from an inside, thereby allowing the adhesive reflective liquid to be reliably injected into the first groove 216-1, the second groove 216-2 and the third groove 216-3, respectively, without leaving any gaps. The reason for dividing the release paper adhesive printing groove 216 into the first groove 216-1, the second groove 216-2 and the third groove 216-3 is to accurately print the release paper adhesive printing groove 216. That is, if the release paper adhesive printing groove 216 is not divided and is formed integrally as a whole, the width of the release paper adhesive printing groove 216 is large, such that when the adhesive reflective liquid is filled, it is not filled uniformly as a whole. Therefore, a phenomenon, in which the release paper adhesive pattern H2 is not accurately printed on the reflective sheet S and the release paper adhesive pattern H2 is partially formed, occurs. However, the present invention has an effect of improving this problem due to the above configuration.

Meanwhile, the release paper adhesive printing groove 216 may be configured to have a thinner depth toward the third groove 216-3 from the inner first groove 216-1. Then, the adhesive reflective liquid to be filled is formed to have a thinner thickness toward the third groove 216-3 from the first groove 216-1, and a portion of the release paper adhesive pattern H2 to be printed on the reflective sheet S corresponding to the first groove 216-1 is printed thickest, and a portion thereof corresponding to the third groove 216-3 is printed thinnest. In this case, excellent adhesiveness is maintained, and when removing the release paper P from the reflective sheet S, the adhesiveness of the outer portion corresponding to the third groove 216-3 is weak, such that the portions corresponding to the third groove 216-3, the second groove 216-2 and the first groove 216-1 are peeled-off step by step, thereby proving an effect of facilitating smooth separation of the release paper.

Next, the release paper supply unit 70 includes a release paper supply roll 72 configured to supply a release paper, and a pair of lamination rollers 74 configured to rotate in a direction where they are engaged with each other. Therefore, the release paper P is supplied between the pair of lamination rollers 74 when the reflective sheet S passes therethrough, so that the reflective sheet S and the release paper P are wound together on the winding roll 60 in a state where they are laminated.

In addition to the dryer 30, a cooler 40 and auxiliary dryers 50 are further installed on the upper portion of the structural frame F, such that the reflective sheet S passing through the upper portion of the structural frame is primary dried by heat in the dryer 30, cooled by the cooler 40, and then dried secondary through the auxiliary dryers 50. Of course, products known in the art may be applied to the dryer 30, the cooler 40 and the auxiliary dryer 50, and therefore will not be described in detail.

Next, it is preferable that a tension load cell 100 is installed in a portion of the structural frame where the reflective sheet S supplied from the reflective sheet supply roll 10 passes, and is configured to constantly adjust a tension of the supplied reflective sheet S.

Figure 3:
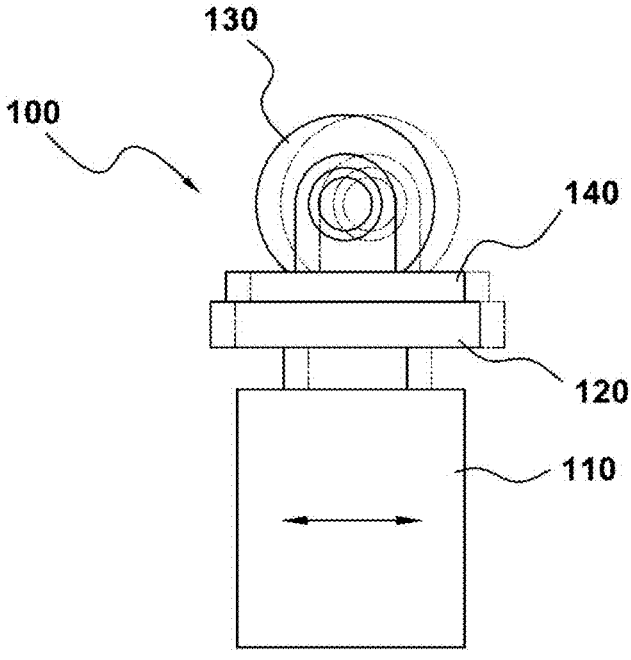
FIG. 3 is an enlarged front view illustrating a tension load cell applied to the present invention.
Figure 4:
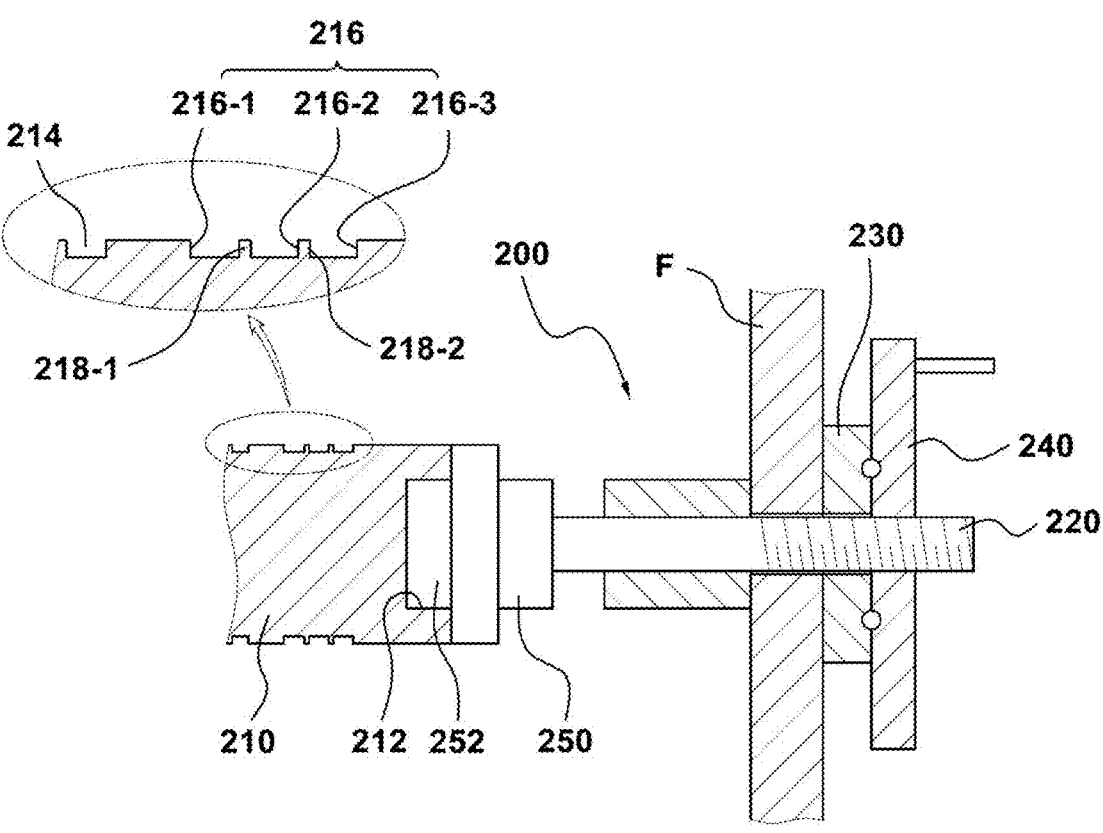
FIG. 4 is a partial cross-sectional view shown to describe a printing roller mounting means applied to the present invention.
Figure 5:
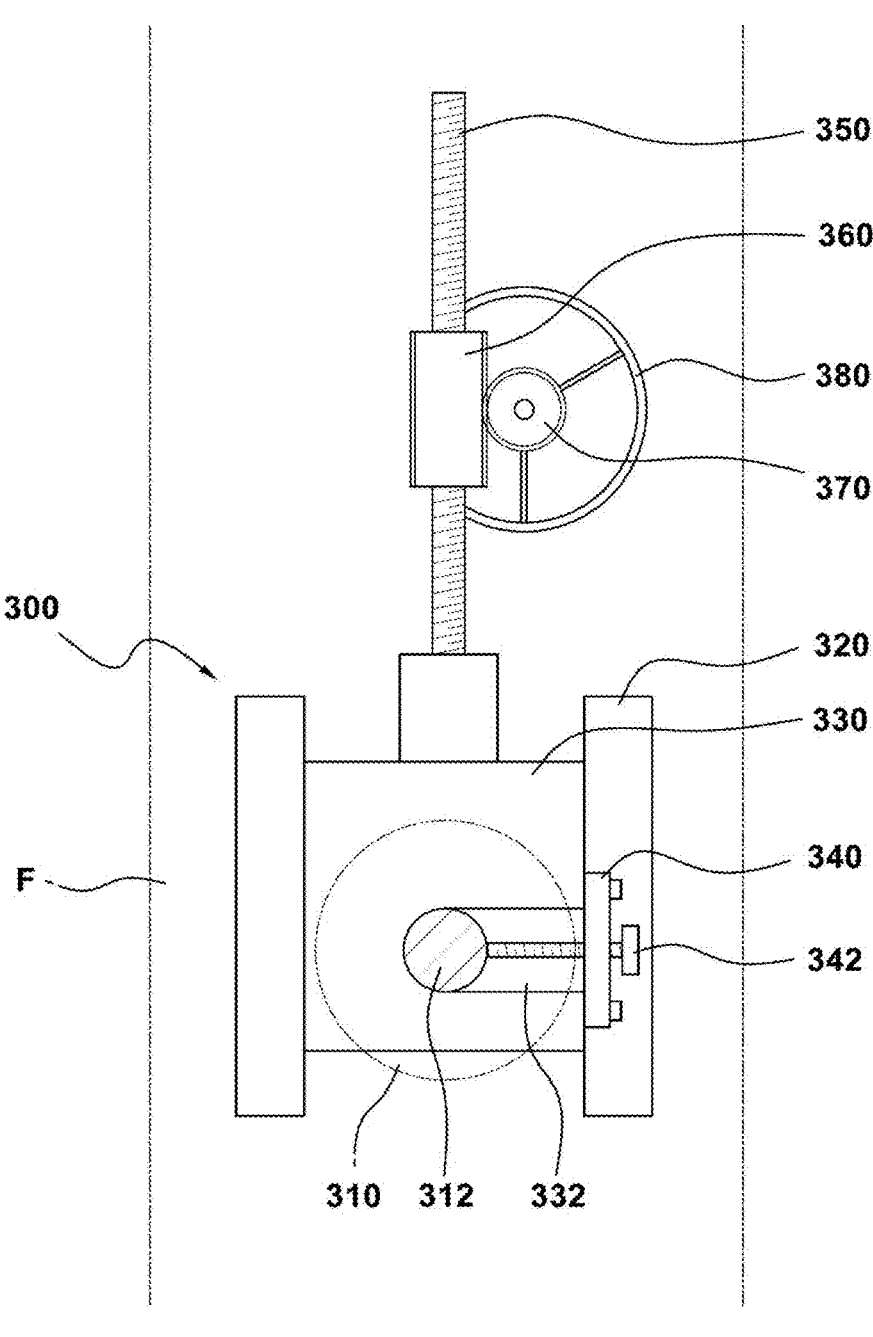
FIG. 5 is a partial front view shown to describe a rubber roller position adjustment means applied to the present invention.
Figure 6:
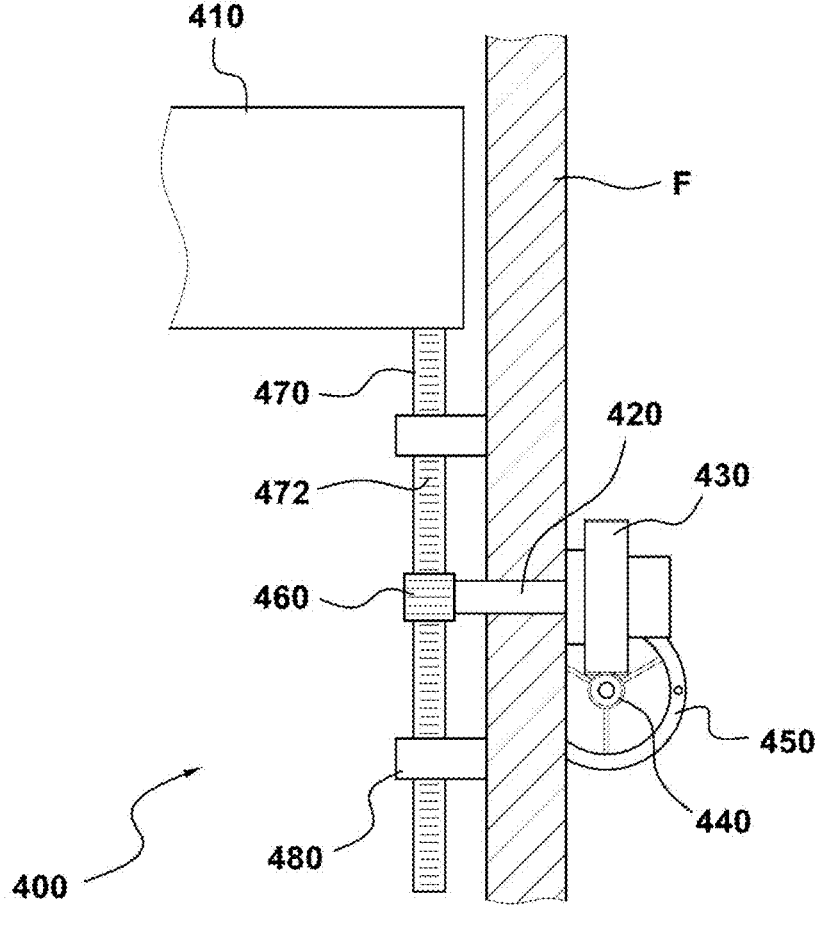
FIG. 6 is a partial cross-sectional view shown to describe a tray position adjustment means applied to the present invention.
Figure 7:
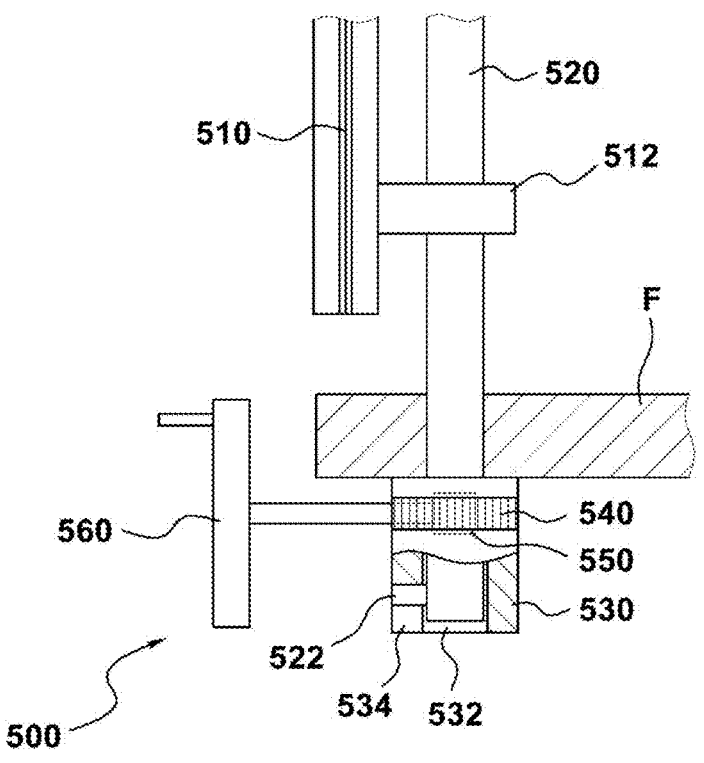
FIG. 7 is a partial cross-sectional view shown to describe a knife operating means applied to the present invention.

As shown in FIG. 3, the tension load cell 100 applied to the present invention includes: a moving part 120 installed on an upper portion of a main body 110 so as to move minutely according to a signal received from a sensor part (not shown) configured to detect the tension of the reflective sheet S back and forth; a bearing housing 140 installed on an upper surface of the moving part 120; and a tension adjustment roller 130 installed in the bearing housing 140, so that the reflective sheet S is guided to the printing unit 20 through the tension adjustment roller 130.

Therefore, when the reflective sheet S supplied from the reflective sheet supply roll 10 is guided to the printing unit 20 through the tension adjustment roller 130, the size of the reflective sheet supply roll 10 is continuously being decreased. In this case, the sensor part in conjunction with the tension adjustment roller 130 detects the tension of the reflective sheet S to automatically and minutely adjust the position of the moving part 120, as shown by virtual lines in FIG. 3, so that the reflective sheet S may always be supplied to the printing unit 20 at a constant tension.

In addition, the apparatus of the present invention further includes: a printing roller mounting means 200 configured to rotatably install the printing roller 210 in the structural frame F; a rubber roller position adjustment means 300 configured to adjust a degree of adhesion with the printing roller 210 by regulating the position of the rubber roller 310; a tray position adjustment means 400 configured to adjust a height of the tray 410 to control a gap between it and the printing roller 210; and a knife operating means 500 configured to adjust the position of the knife 510 so that the knife 510 selectively comes into close contact with the printing roller 210.

First, the printing roller mounting means 200 are respectively installed on both sides of the structural frame F to support both ends of the printing roller 210, and include: a longitudinal moving rod 220 which is installed to penetrate a portion of the structural frame F at a position corresponding to the printing roller 210, and has a male thread portion formed on an outer peripheral surface at a rear end portion thereof; a binder 250 formed integrally with a front end of the longitudinal moving rod 220 and having a binder protrusion 252 protruding from a front surface thereof; a support plate 230 fixed to the structural frame F so that the longitudinal moving rod 220 penetrates; and a circular plate 240 which is rotatably coupled to a front surface of the support plate 230, and has a hole formed in a center thereof, through which the longitudinal moving rod 220 penetrates, and a female thread portion formed in the hole corresponding to the male thread portion of the longitudinal moving rod 220. Therefore, when rotating the circular plate 240, the longitudinal moving rod 220 will move forward or backward along threads of the male and female thread portions.

To install the printing roller 210 through the printing roller mounting means 200, the printing roller 210 may be placed at a position corresponding to the longitudinal moving rod 220, then the circular plate 240 is rotated to move forward the longitudinal moving rod 220. To this end, binding holes 212 corresponding to the binder protrusions 252 are formed in both ends of the printing roller 210. The printing roller 210 is placed so that the binder protrusions 252 are inserted into the binding holes 212, and in this state, the longitudinal moving rod 220 is moved forward to fix in a way that the binder protrusions 252 are inserted into the binding holes 212.

Next, the rubber roller position adjustment means 300 are respectively installed on both sides of the structural frame F to support both ends of the rubber roller 310, and include: a pair of moving plate guides 320 fixed to the structural frame F at a predetermined interval at positions corresponding to the rubber roller 310; a vertical moving plate 330 which is fitted and assembled between the pair of moving plate guides 320 to be moved vertically along the moving plate guides 320, and has an axis insertion hole 332 formed in the middle thereof, into which the axis 312 of the rubber roller 310 is inserted, wherein the axis insertion hole 332 is formed to open in one direction so that the axis 312 of the rubber roller 310 can be inserted; a cover plate 340 fixed to a surface having an opening communicated with the axis insertion hole 332 of the vertical moving plate 330, thus to selectively cover the opening; a pressing bolt 342 fastened to penetrate the cover plate 340, of which an end is installed in close contact with an axis of the rubber roller 310 to hold the axis 312 of the rubber roller 310 so as not to be moved along the axis insertion hole 332; a vertical rod 350 extending upward from an upper portion of the vertical moving plate 330 and having a male thread portion formed on an outer peripheral surface thereof; a rubber-roller worm gear 360 which is rotatably installed in the structural frame F at a position corresponding to the middle portion of the vertical rod 350 and has a hollow in which a female thread portion screwed with the male thread portion of the vertical rod is formed in the center thereof so that the vertical rod 350 is fastened therethrough; a rubber-roller worm wheel 370 which is rotatably installed in the structural frame F and is meshed with the rubber-roller worm gear 360; and a rubber-roller handle 380 configured to rotate the rubber-roller worm wheel 370.

Therefore, to install the rubber roller 310 on the vertical moving plate 330, the axis of the rubber roller 310 may be inserted into the axis insertion hole 332 of the vertical moving plate 330 and then fixed by pressing with the pressing bolt 342 so as not to be moved. To adjust the vertical position of the rubber roller 310, when rotating the rubber-roller worm wheel 370 in one direction or a direction opposite thereto through the rubber-roller handle 380, the rubber-roller worm gear 360 rotates, then the vertical rod 350 is moved up or down along threads, and the vertical moving plate 330 is also moved up or down together with the vertical rod 350 to adjust the position of the rubber roller 310.

Next, the tray position adjustment means 400 are respectively installed on both sides of the structural frame F to support both ends of the tray 410, and include: a rotation axis 420 installed to penetrate the structural frame F blow the tray 410; a tray worm gear 430 coupled to an outer end (i.e., a right end in FIG. 6) of the rotation axis 420 to be rotated together with the rotation axis 420; a tray worm wheel 440 installed to be meshed with the tray worm gear 430; a tray handle 450 configured to rotate the tray worm wheel 440; a pinion gear 460 coupled to an inner end (i.e., a left end in FIG. 6) of the rotation axis 420 to be rotated together with the rotation axis 420; a lifting bar 470 extending vertically downward from a lower portion of the tray 410 and has a rack gear 472 formed on an outer peripheral surface thereof to be meshed with the pinion gear 460; and supports 480 fixed to the structural frame F to hold the lifting bar 470 so as not to be shaken during moving up or down.

Therefore, to adjust the vertical position of the tray 410, the tray worm wheel 440 may rotate in one direction or a direction opposite thereto through the tray handle 450. Then, as the tray worm gear 430 rotates, the rotation axis 420 is also rotated, and the pinion gear 460 coupled to the inner end of the rotation axis 420 is rotated so that the lifting bar 470 is moved up or down along the meshed rack gear 472, and then the tray 410 is also moved up or down together with the lifting bar 470 to adjust the position thereof.

Next, the knife operating means 500 includes: a rotating rod 520 which is rotatably assembled to the structural frame F before the printing roller 210, of which a lower end protrudes outward (i.e., downward in FIG. 7) by penetrating the structural frame F, and includes knives 510 installed on an upper portion thereof at a predetermined interval by being fixed thereto through a plurality of fixtures 512 to be operated together, and a locking protrusion 522 formed on a portion of the lower end, which protrudes in a direction perpendicular to a longitudinal direction thereof; a circular fixing block 530 rotatably installed on an outer side of the structural frame F, and including a rod insertion hole 532 formed therein, into which the lower end of the rotating rod 520 is inserted, and a locking groove 534 formed in a portion thereof defining the rod insertion hole 532 by penetrating in one direction, through which the locking protrusion 522 of the rotating rod 520 is inserted and coupled; a knife worm gear 540 integrally formed with a portion of the circular fixing block 530 along an outer peripheral surface thereof; a knife worm wheel 550 which is meshed with the knife worm gear 540 to be rotated; and a knife handle 560 configured to rotate the knife worm wheel 550.

Therefore, to adjust the position of the knife 510, when rotating the knife worm wheel 550 in one direction or a direction opposite thereto through the knife handle 560, the knife worm gear 540 rotates and the circular fixing block 530 is also rotated together, and the rotating rod 520 connected to the circular fixing block 530 by the locking protrusion 522 and the locking groove 534 is also rotated together, such that the knife coupled to the rotating rod 520 selectively comes into contact with or is separated from the outer peripheral surface of the printing roller 210.

Meanwhile, each of the reflective sheet supply roll 10, the printing roller 210, the release paper supply roll 72 and the winding roll 60 installed in the apparatus of the present invention is configured to rotate by a power received from a motor through a power transmission means. As the power transmission method, a conventional chain and sprocket method may be applied to the present invention.

Now, an operation and effects of the apparatus for manufacturing an LED reflective sheet according to the present invention configured as described above will be described.

Figure 8:
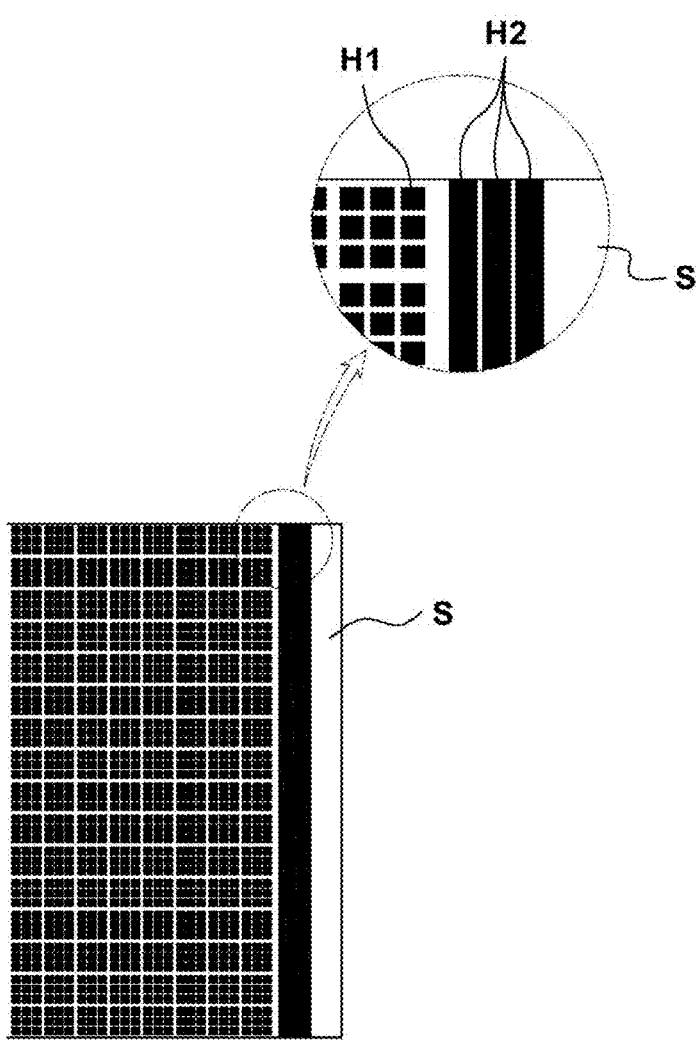
FIG. 8 is a front view illustrating a portion of a reflective sheet manufactured by the apparatus for manufacturing an LED reflective sheet according to the present invention.

In the apparatus for manufacturing an LED reflective sheet according to the present invention, the reflective sheet S supplied from the reflective sheet supply roll 10 passes through the printing unit 20 consisting of the rubber roller 310 and the printing roller 210, and in this process, the light-induced pattern H1 and the release paper adhesive pattern H2 are printed on the surface of the reflective sheet S as shown in FIG. 8.

That is, the tray 410 for storing the adhesive reflective liquid is installed at the lower portion of the printing roller 210, and when the printing roller 210 rotates while a portion of the lower side of the printing roller 210 is immersed in the adhesive reflective liquid, the adhesive reflective liquid is applied to the outer peripheral surface of the printing roller 210. In addition, the adhesive reflective liquid applied to the outer peripheral surface of the printing roller is removed by the knife 510 so that the adhesive reflective liquid remains only in the pattern printing grooves 214 and the release paper adhesive printing grooves 216. In this state, as the printing roller 210 rotates, the adhesive reflective liquid remaining in the pattern printing grooves 214 and the release paper adhesive printing grooves 216 of the printing roller 210 is transferred to the reflective sheet S passing between the rubber roller 310 and the printing roller to be printed thereon.

When the light-induced pattern H1 and the release paper adhesive pattern H2 are printed on the reflective sheet S as described above, the reflective sheet is dried while passing through the dryer 30, and then wound on the winding roll 60 to be discharged. At this time, the reflective sheet S passes through the pair of lamination rollers 74 to be laminated with the release paper P and is wound on the winding roll 60 in a state where they are laminated.

That is, when the release paper P is supplied from the release paper supply roll 72 to the pair of lamination rollers 74 rotating in a direction where they are meshed with each other, the reflective sheet S and the release paper P are laminated while passing together between the lamination rollers 74 and wound on the winding roll 60. Then, when the release paper P is laminated to the reflective sheet S, it is adhered to the light-induced pattern H1 and the release paper adhesive pattern H2 formed on the reflective sheet S to be maintained in the laminated state.

When manufacturing the reflective sheet S in this way, the present invention has advantages including: the tension of the reflective sheet S is constantly adjusted by the tension load cell 100, such that printing may be performed in a tense state; the printing roller 210 may be installed and replaced through the printing roller mounting means 200; the position of the rubber roller 310 is adjusted through the rubber roller position adjustment means 300 to control the degree of adhesion with the printing roller 210; the height of the tray 410 may be adjusted through the tray position adjustment means 400 to control a gap between it and the printing roller 210. Of course, the knife 510 comes into close contact with the printing roller 210 only when a printing work is performed through the knife operating means 500.

As shown in FIG. 8, the LED reflective sheet manufactured in this way is characterized in that, when printing the light-induced pattern H1 on the reflective sheet S through the printing roller 210, the release paper adhesive pattern H2 is also printed, and both ends of the release paper P are adhered to the release paper adhesive pattern H2 during attaching the release paper P to the reflective sheet S, thus a lifting phenomenon between the release paper P and the reflective sheet S does not occur, and thereby the problem in terms of a decrease in adhesion due to air inflow between the release paper and the reflective sheet is resolved, and the reflective sheet may be stored for a long period of time.

As such, the present invention has been illustrated and described above in relation to specific embodiments, but it will be able to understand easily by anyone of those skilled in the art that various modifications and alternations may be made without departing from the spirit and scope of the invention as indicated by the claims.

DESCRIPTION OF REFERENCE NUMERALS

10: Reflective sheet supply roll
20: Printing unit
30: Dryer
40: Cooler
50: Auxiliary dryer
60: Winding roll
70: Release paper supply unit
72: Release paper supply roll
74: Lamination roller
100: Tension load cell
200: Printing roller mounting means
210: Printing roller
214: Pattern printing groove
216: Release paper adhesive printing groove
300: Rubber roller position adjustment means
310: Rubber roller
400: Tray position adjustment means
410: Tray
500: Knife operating means
510: Knife
F: Structural frame
H1: Light-induced pattern
H2: Release paper adhesive pattern
P: Release paper
S: Reflective sheet

What is claimed is:

1. An apparatus for manufacturing an LED reflective sheet, the apparatus comprising:

a structural frame;

a reflective sheet supply roll rotatably installed in the middle of the structural frame to supply a reflective sheet;

a printing unit installed in the front of the structural frame to print a light-induced pattern and a release paper adhesive pattern on the supplied reflective sheet through an adhesive reflective liquid;

a dryer installed on an upper portion of the structural frame to dry the reflective sheet on which the light-induced pattern and the release paper adhesive pattern are printed while passing therethrough;

a winding roll rotatably installed in the rear of the structural frame to wind the reflective sheet dried while passing through the dryer in the form of a roll;

a release paper supply unit configured to supply a release paper to a surface of the reflective sheet on which the light-induced pattern and the release paper adhesive pattern are printed before the reflective sheet is wound on the winding roll so that the release paper and the reflective sheet are wound together in a state where they are laminated; and a plurality of guide rollers installed between the reflective sheet supply roll, the printing unit, the dryer and the winding roll to guide the reflective sheet, wherein the printing unit includes a rubber roller and a printing roller which are arranged vertically to guide the reflective sheet therebetween while rotating in a direction where they are engaged with each other, and is configured so that: the printing roller includes pattern printing grooves into which an adhesive reflective liquid for printing the light-induced pattern is injected and release paper adhesive printing grooves into which the adhesive reflective liquid for printing the release paper adhesive pattern is injected, which are formed in an outer peripheral surface thereof; a tray for storing the adhesive reflective liquid is installed under the printing roller, thereby, when the printing roller rotates while a portion of a lower side of the printing roller is immersed in the adhesive reflective liquid, the adhesive reflective liquid is applied to an outer peripheral surface of the printing roller; a knife having an end in contact with the outer peripheral surface of the printing roller is installed on one side of the printing roller, thereby when the printing roller to which the adhesive reflective liquid is applied rotates, the adhesive reflective liquid applied to the outer peripheral surface of the printing roller is removed so that the adhesive reflective liquid remains only in the pattern printing grooves and the release paper adhesive printing grooves; and thus, when the reflective sheet passes between the rubber roller and the printing roller, the adhesive reflective liquid remaining in the pattern printing grooves and the release paper adhesive printing grooves of the printing roller is transferred to the reflective sheet to be printed thereon, wherein the release paper supply unit includes a release paper supply roll configured to supply a release paper, and a pair of lamination rollers configured to rotate in a direction where they are engaged with each other, thereby, the release paper is supplied between the pair of lamination rollers when the reflective sheet passes therethrough, so that the reflective sheet and the release paper are wound together on the winding roll in a state where they are laminated, and wherein the apparatus further comprising:
a tension load cell installed in a portion of the structural frame where the reflective sheet supplied from the reflective sheet supply roll passes to constantly adjust a tension of the supplied reflective sheet;
a printing roller mounting means configured to rotatably install the printing roller in the structural frame;
a rubber roller position adjustment means configured to adjust a degree of adhesion with the printing roller by regulating the position of the rubber roller;
a tray position adjustment means configured to adjust a height of the tray to control a gap between the tray and the printing roller; and
a knife operating means configured to adjust the position of the knife so that the knife selectively comes into contact with the printing roller.

2. The apparatus for manufacturing an LED reflective sheet according to claim 1, wherein the release paper adhesive printing groove formed in the printing roller has a constant width, and includes a first partition and a second partition formed in parallel to each other at a predetermined interval in the middle of a width direction, so that the release paper adhesive printing groove is divided into a first groove, a second groove and a third groove from an inside, thereby allowing the adhesive reflective liquid to be reliably injected into the first groove, the second groove and the third groove, respectively, without leaving any gaps.

3. The apparatus for manufacturing an LED reflective sheet according to claim 1, wherein the printing roller mounting means are respectively installed on both sides of the structural frame to support both ends of the printing roller, and include:
a longitudinal moving rod which is installed to penetrate a portion of the structural frame at a position corresponding to the printing roller, and has a male thread portion formed on an outer peripheral surface at a rear end portion thereof;
a binder formed integrally with a front end of the longitudinal moving rod and having a binder protrusion protruding from a front surface thereof;
a support plate fixed to the structural frame so that the longitudinal moving rod penetrates; and
a circular plate which is rotatably coupled to a front surface of the support plate, and has a hole formed in a center thereof, through which the longitudinal moving rod penetrates, and a female thread portion formed in the hole corresponding to the male thread portion of the longitudinal moving rod,
wherein, when rotating the circular plate, the longitudinal moving rod moves forward or backward along threads; and binding holes corresponding to the binder protrusions are formed in both ends of the printing roller, thus the printing roller is placed so that the binder protrusions are inserted into the binding holes, and in this state, the longitudinal moving rod is moved forward to cause the binder protrusions are inserted into the binding holes and fixed thereto.

4. The apparatus for manufacturing an LED reflective sheet according to claim 1, wherein the rubber roller position adjustment means are respectively installed on both sides of the structural frame to support both ends of the rubber roller, and include:
a pair of moving plate guides fixed to the structural frame at a predetermined interval at positions corresponding to the rubber roller;
a vertical moving plate which is fitted and assembled between the pair of moving plate guides to be moved vertically along the moving plate guides, and has an axis insertion hole formed in the middle thereof, into which an axis of the rubber roller is inserted, wherein the axis insertion hole is formed to open in one direction so that the axis of the rubber roller can be inserted;
a cover plate fixed to a surface having an opening communicated with the axis insertion hole of the vertical moving plate, thus to selectively cover the opening;
a pressing bolt fastened to penetrate the cover plate, of which an end is installed in close contact with the axis of the rubber roller to hold the axis of the rubber roller so as not to be moved along the axis insertion hole;
a vertical rod extending upward from an upper portion of the vertical moving plate and having a male thread portion formed on an outer peripheral surface thereof;
a rubber-roller worm gear which is rotatably installed in the structural frame at a position corresponding to the middle portion of the vertical rod and has a hollow in which a female thread portion screwed with the male thread portion of the vertical rod is formed in the center thereof so that the vertical rod is fastened therethrough;
a rubber-roller worm wheel which is rotatably installed in the structural frame and is meshed with the rubber-roller worm gear; and
a rubber-roller handle configured to rotate the rubber-roller worm wheel, and
wherein the axis of the rubber roller is inserted into the axis insertion hole of the vertical moving plate, and then fixed so as not to be moved by the pressing bolt, and in this state, when rotating the rubber-roller worm wheel in one direction or a direction opposite thereto through the rubber-roller handle, the rubber-roller worm gear rotates, then the vertical rod is moved up or down along threads, and the vertical moving plate is also moved up or down together with the vertical rod to adjust the position of the rubber roller.

5. The apparatus for manufacturing an LED reflective sheet according to claim 1, wherein the tray position adjustment means are respectively installed on both sides of the structural frame to support both ends of the tray, and include:

a rotation axis installed to penetrate the structural frame blow the tray;

a tray worm gear coupled to an outer end of the rotation axis to be rotated together with the rotation axis;

a tray worm wheel installed to be meshed with the tray worm gear;

a tray handle configured to rotate the tray worm wheel;

a pinion gear coupled to an inner end of the rotation axis to be rotated together with the rotation axis;

a lifting bar extending vertically downward from a lower portion of the tray and has a rack gear formed on an outer peripheral surface thereof to be meshed with the pinion gear; and supports fixed to the structural frame to hold the lifting bar so as not to be shaken during moving up or down, wherein, when rotating the tray worm wheel in one direction or a direction opposite thereto through the tray handle, the tray worm gear rotates, and the rotation axis is also rotated, and the pinion gear coupled to an inner end of the rotation axis is rotated so that the lifting bar is moved up or down along the meshed rack gear to adjust the position of the tray.

6. The apparatus for manufacturing an LED reflective sheet according to claim 1, wherein the knife operating means includes:

a rotating rod which is rotatably assembled to the structural frame before the printing roller, of which a lower end protrudes downward by penetrating the structural frame, and includes knives installed on an upper portion thereof at a predetermined interval by being fixed thereto through a plurality of fixtures to be operated together, and a locking protrusion formed on a portion of the lower end, which protrudes in a direction perpendicular to a longitudinal direction thereof;

a circular fixing block rotatably installed on an outer side of the structural frame, and including a rod insertion hole formed therein, into which the lower end of the rotating rod is inserted, and a locking groove formed in a portion thereof defining the rod insertion hole by penetrating in one direction, through which the locking protrusion of the rotating rod is inserted and coupled;

a knife worm gear integrally formed with a portion of the circular fixing block along an outer peripheral surface thereof;

a knife worm wheel which is meshed with the knife worm gear to be rotated; and a knife handle configured to rotate the knife worm wheel, wherein, when rotating the knife worm wheel in one direction or a direction opposite thereto through the knife handle, the knife worm gear rotates and the circular fixing block is also rotated together, and the rotating rod connected to the circular fixing block by the locking protrusion and the locking groove is also rotated together, such that the knife coupled to the rotating rod selectively comes into contact with or is separated from the outer peripheral surface of the printing roller.

*     *     *     *     *